US010886606B2

(12) United States Patent
Kamgaing et al.

(10) Patent No.: US 10,886,606 B2
(45) Date of Patent: Jan. 5, 2021

(54) MICROELECTRONIC DEVICES DESIGNED WITH FLEXIBLE PACKAGE SUBSTRATES WITH DISTRIBUTED STACKED ANTENNAS FOR HIGH FREQUENCY COMMUNICATION SYSTEMS

(71) Applicant: Intel Corporation, Santa Clara, CA (US)

(72) Inventors: Telesphor Kamgaing, Chandler, AZ (US); Sasha N. Oster, Chandler, AZ (US); Georgios C. Dogiamis, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/464,678

(22) PCT Filed: Dec. 30, 2016

(86) PCT No.: PCT/US2016/069621
§ 371 (c)(1),
(2) Date: May 28, 2019

(87) PCT Pub. No.: WO2018/125240
PCT Pub. Date: Jul. 5, 2018

(65) Prior Publication Data
US 2019/0288382 A1     Sep. 19, 2019

(51) Int. Cl.
*H01Q 1/38*     (2006.01)
*H01Q 21/00*    (2006.01)
(Continued)

(52) U.S. Cl.
CPC ........... *H01Q 1/38* (2013.01); *H01L 23/4985* (2013.01); *H01L 23/522* (2013.01); *H01L 23/66* (2013.01);
(Continued)

(58) Field of Classification Search
CPC ........ H01Q 1/38; H01Q 1/2283; H01Q 1/243; H01Q 1/24; H01Q 9/0407; H01Q 9/0414;
(Continued)

(56) References Cited

U.S. PATENT DOCUMENTS 5,444,453 A    8/1995  Lalezari
7,049,682 B1   5/2006  Mathews et al.
(Continued)

OTHER PUBLICATIONS

International Preliminary Report on Patentability for International Patent Application No. PCT/US2016/069621, dated Jul. 11, 2019, 7 pages.
(Continued)

*Primary Examiner* — Jimmy T Vu
(74) *Attorney, Agent, or Firm* — Schwabe, Williamson & Wyatt, P.C.

(57) ABSTRACT

Embodiments of the invention include a microelectronic device that includes a first substrate having organic dielectric material, conductive layers, and a first portion of a distributed antenna unit. The first substrate supports at least one radio frequency (RF) component. A second substrate is coupled to the first substrate. The second substrate is integrated with a housing of the microelectronic device and includes a second portion of the distributed antenna unit for transmitting and receiving communications at a frequency of approximately 4 GHz or higher.

20 Claims, 5 Drawing Sheets

(51) Int. Cl.
*H01Q 1/24* (2006.01)
*H01Q 21/22* (2006.01)
*H01L 23/66* (2006.01)
*H01L 23/522* (2006.01)
*H01Q 9/04* (2006.01)
*H01Q 19/22* (2006.01)
*H01L 23/498* (2006.01)
*H01Q 1/22* (2006.01)
*H01Q 21/06* (2006.01)

(52) U.S. Cl.
CPC ........... *H01Q 1/2283* (2013.01); *H01Q 1/243* (2013.01); *H01Q 9/0407* (2013.01); *H01Q 9/0414* (2013.01); *H01Q 19/22* (2013.01); *H01Q 21/0025* (2013.01); *H01Q 21/065* (2013.01); *H01Q 21/22* (2013.01); *H01L 23/49816* (2013.01); *H01L 2223/6677* (2013.01); *H01L 2224/16225* (2013.01); *H01L 2924/15311* (2013.01); *H01L 2924/181* (2013.01); *H01Q 1/24* (2013.01)

(58) Field of Classification Search
CPC .. H01Q 19/22; H01Q 21/0025; H01Q 21/065; H01Q 21/22; H01L 23/4985; H01L 23/522; H01L 23/66; H01L 23/49816; H01L 223/6677; H01L 2224/16225; H01L 2924/15311; H01L 2924/181
See application file for complete search history.

(56) References Cited

U.S. PATENT DOCUMENTS

| | | | |
|---|---|---|---|
| 8,816,906 | B2 | 8/2014 | Kamgaing et al. |
| 9,882,274 | B2* | 1/2018 | de Rochemont ........ H01Q 7/00 |
| 2013/0009320 | A1* | 1/2013 | Yoo ..................... H01L 23/5226 257/774 |
| 2016/0049723 | A1 | 2/2016 | Baks et al. |
| 2016/0149292 | A1 | 5/2016 | Ganton et al. |

OTHER PUBLICATIONS

International Search Report and Written Opinion for International Patent Application No. PCT/US2016/069621 dated Sep. 28, 2017, 8 pgs.

* cited by examiner

MICROELECTRONIC DEVICES DESIGNED WITH FLEXIBLE PACKAGE SUBSTRATES WITH DISTRIBUTED STACKED ANTENNAS FOR HIGH FREQUENCY COMMUNICATION SYSTEMS

CROSS-REFERENCE TO RELATED APPLICATION

This patent application is a U.S. National Phase Application under 35 U.S.C. § 371 of International Application No. PCT/US2016/069621, filed Dec. 30, 2016, entitled "MICROELECTRONIC DEVICES DESIGNED WITH FLEXIBLE PACKAGE SUBSTRATES WITH DISTRIBUTED STACKED ANTENNAS FOR HIGH FREQUENCY COMMUNICATION SYSTEMS," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices that are designed with flexible millimeter wave package substrates with distributed stack antennas for high frequency communication systems.

BACKGROUND OF THE INVENTION

Future wireless products are targeting operation frequencies much higher than the lower GHz range utilized presently. For instance 5G ($5^{th}$ generation mobile networks or $5^{th}$ generation wireless systems) communications are expected to operate at a frequency greater than or equal to 15 GHz. Moreover, the current WiGig (Wireless Gigabit Alliance) products operate around 60 GHz (e.g. 57-66 GHz worldwide). Other applications including automotive radar and medical imaging utilize wireless communication technologies in the millimeter wave frequencies (e.g., 24 GHz-300 GHz).

WiGig systems and the next generation of mobile and wireless communication standards (5G) require phased array antennas to compensate for both free space path losses and low transistor output power. One possible implementation of the antennas is the stacked patch antenna in which a parasitic patch is used in conjunction with a main patch to increase the bandwidth while maintaining a high gain in comparison to other antennas. The co-integration of the radio frequency chip and antenna on the same substrate will lead to losses inside the device housing.

DETAILED DESCRIPTION OF THE INVENTION

Figure 1:
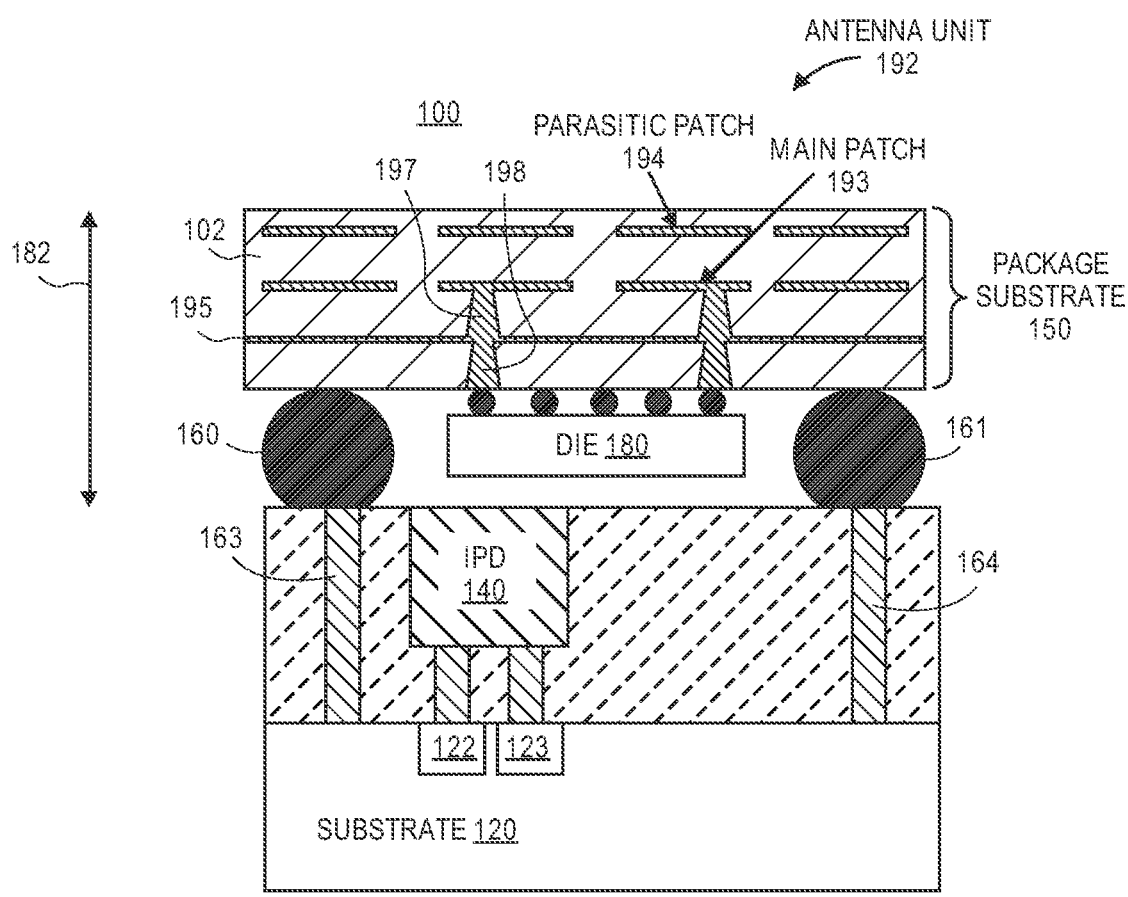
FIG. 1 illustrates a microelectronic device having a stacked patch antenna.

Described herein are microelectronic devices that are designed with flexible package substrates (e.g., flexible millimeter wave package substrates) with distributed antenna units for high frequency communication systems. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order to not obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

For high frequency (e.g., 5G, WiGig) wireless applications of millimeter (e.g., 1-10 mm, any mm wave or higher) wave communication systems, the present design utilizes a new packaging architecture having a flexible substrate and an antenna integration scheme that reduces within housing losses while maintaining a high gain offered by a stacked patch antenna.

The present design splits the millimeter wave antenna implementation between a flexible package substrate and a secondary substrate such as the housing of the microelectronic device. Different coupling mechanisms are used to couple the signal between the two antenna parts. Additionally, the present design can integrate monopole, dipole, Vivaldi radiators and side radiating antenna elements among other types of antennas.

The implementation of at least one section of the antenna on the microelectronic device housing reduces the losses associated with the signal attenuation through a traditional housing material. The flexible substrate enables the integration of the active section of the RF module on an ultra thin substrate and therefore facilitates its use in different applications including when a form factor of a device (e.g., cell phones, PDAs, tablets, wearables, ultrabooks, etc) is a restriction. In some embodiments, there is an air gap between the antenna elements, which results in higher efficiency as less power is trapped in low electric fields. The flexibility of the substrate enables the orientation of the antenna in any desired direction towards a maximum signal strength.

In one example, the present design enables a 5G architecture that operates at a high frequency (e.g., at least 20 GHz, at least 25 GHz, at least 28 GHz, at least 30 GHz, 39 GHz, 60 GHz, 73 GHz etc.) and may also have approximately 1-50 gigabits per second (Gbps) connections to end points. In another example, the present design operates at lower frequencies (e.g., at least 4 GHz, approximately 4 GHz).

FIG. 1 illustrates a microelectronic device having a stacked patch antenna in accordance with one embodiment. The microelectronic device 100 includes an optional substrate 120 and a package substrate 150 having at least one antenna unit 192 with a main patch 193 (e.g., main patch with a first resonant frequency) and a parasitic patch 194 (e.g., parasitic patch with a second resonant frequency). Alternatively, the at least one antenna unit 192 or an additional antenna unit can integrate monopole, dipole, and side radiating antenna elements among other types of antennas. The interlayer dielectric material between the main and parasitic patches is organic dielectric material 102 of the package substrate 150. The main patch or bottom antenna element 193 can be directly connected to the radio frequency die 180. The package substrate 150 includes at least one antenna unit 192, conductive layers (e.g., 193-195), dielectric material 102 (e.g., organic material, low temperature co-fired ceramic materials, liquid crystal polymers, etc.), and different levels of conductive connections 197-198. The components 122-123 of the substrate 120 and IPD (Integrated Passive Device) 140 can communicate with components of the substrate 150 or other components not shown in FIG. 1 using connections 163-164 and second level interconnects (e.g. solder balls, copper pillars, gold bumps, solder paste, liquid metal, capacitive or electromagnetic couplers) 160-161. The IPD 140 may include any type of passives including inductors, transformers, capacitors, and resistors. In one example, capacitors on the IPD die may be used for power delivery. In another example, resistors on the same or a different IPD may be used for digital signal equalization. In another example, the substrate 120 is a printed circuit board. The main patch and parasitic patch can be created during substrate manufacturing as part of the build up or core layers of the substrate 150.

Figure 2:
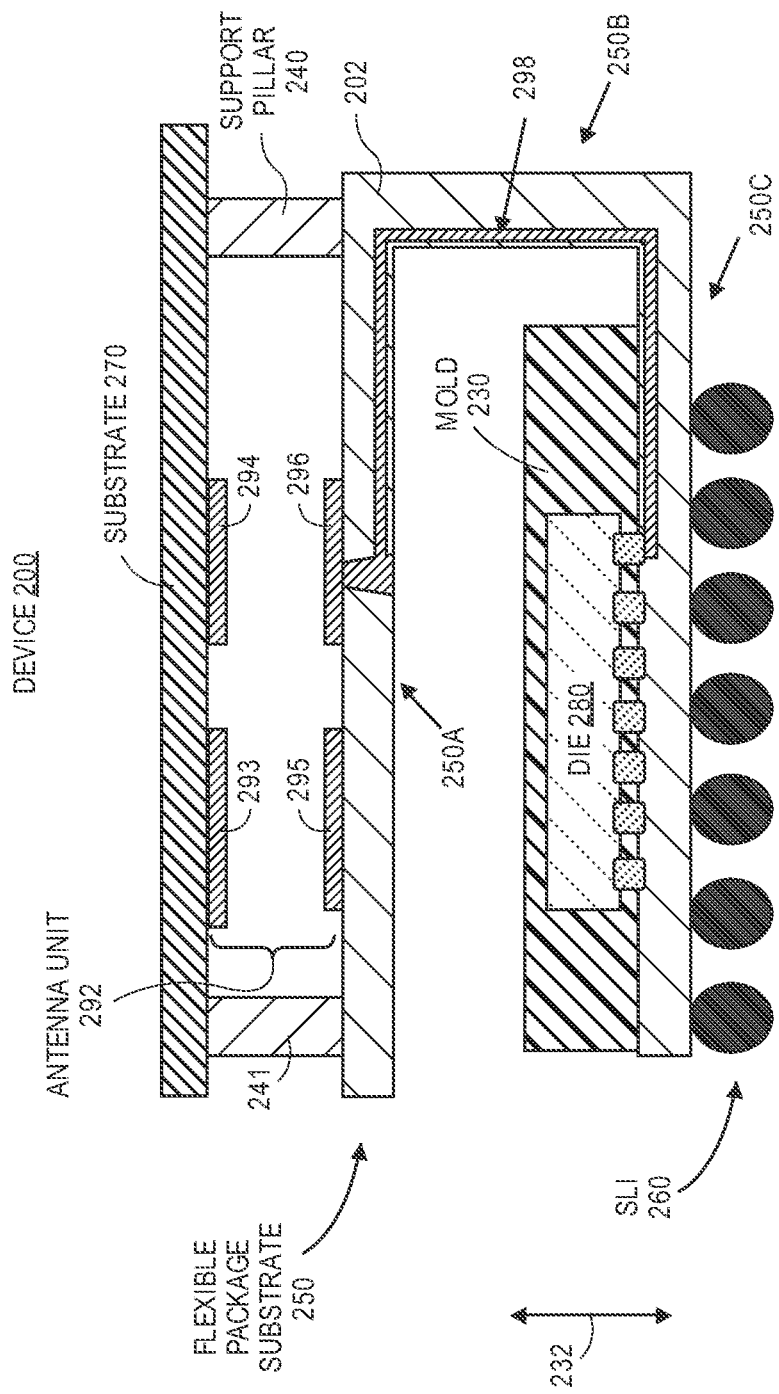
FIG. 2 illustrates a microelectronic device having a flexible substrate and a distributed antenna unit in accordance with one embodiment.

In this example, FIG. 1 illustrates a cross-sectional view of a millimeter wave wireless device 100. A relatively thick package substrate 150 is used to implement a planar phased array. A stacked patch antenna substantially increases package thickness and large second level interconnects (SLIs) 160-161 (e.g., BGAs) are used unless the substrate 120 (e.g., mother board) has a cavity or the die 180 is extremely thin. The device 100 has a thickness 182 less than 1 millimeter. FIG. 2 illustrates a microelectronic device having a flexible substrate and a distributed antenna unit in accordance with one embodiment. The microelectronic device 200 includes a flexible package substrate 250 having a first portion of the at least one distributed antenna unit 292 with antenna elements 295-296 (e.g., main patches 295-296 as illustrated in FIG. 2). A second portion of the at least one distributed stacked antenna unit 292 includes antenna elements 293-294 (e.g., parasitic patches 293-294 as illustrated in FIG. 2) that are positioned on a different substrate 270 (e.g., a device housing). The antenna elements (e.g., main patches and parasitic patches) are capacitively coupled. Alternatively, the at least one distributed antenna unit 292 or an additional antenna unit can integrate monopole, dipole, and side radiating antenna elements among other types of antennas. The substrates 250 and 270 are separated with support pillars 240-241 (e.g., dielectric support pillars, non-dielectric support pillars) that can have different height or thickness based on a wireless application. In some embodiments, non-dielectric pillars 240-241 may be used. Such pillars may be made out of metal or out of material composites. The pillars may be designed to act as reflectors to enhance the overall antenna directivity and efficiency.

In one example, for a frequency of approximately 30 GHZ, the pillars 240-241 may have a height or thickness of 200 to 300 microns. In another example, for a frequency of approximately 90 GHZ, the pillars 240-241 may have a height or thickness of approximately 80 to 100 microns. The supporting pillars 240-241 (e.g., solder balls, ceramic or plastic posts) may be used to maintain the separation between the substrates 250 and 270. The height of the pillars may be changed to adapt the frequency of operation of the antenna (e.g., the frequency bands may be changed depending on a targeted country in which a device will be used). The gap between the main and parasitic patches may also be filled with low loss dielectric material. Also, different supporting pillars (e.g., spacer material) can be used between the substrates 250 and 270. The spacers can be attached to either of the substrates or merely inserted between the substrates. A desired performance can be achieved when the spacer material does not overlap with the antenna elements.

The main patch or bottom antenna elements 295-296 can be directly connected to the radio frequency die 280. The flexible package substrate 250 can be bent, folded, or twisted in multiple regions to create different sections 250a-250c or any desired positioning of these sections. The package substrate 250 includes at least one element of a distributed antenna unit 292, conductive layers (e.g., transmission lines 298), dielectric material 202 (e.g., organic material, low temperature co-fired ceramic materials, liquid crystal polymers, etc.), and different levels of conductive connections. In one example, the package substrate 250 has a thickness of 50 to 100 microns for ultra thin microelectronic devices. The section 250c includes an ultra-thin multilayer organic package substrate on which at least one semiconductor die 280 is attached using either wirebonding or flip chip assembly. The semiconductor die 280 contains at least a radio frequency circuit such as a transceiver that operates in the GHz frequency range. The microelectronic die 280 is overmolded with mold material 230 to provide mechanical stability. The mold material 230 and section 250c can have a thickness 232 of 100 to 200 microns. The section 250a of the package substrate 250 contains one or multiple distributed antenna units 292. The antennas may be individual or arrange in a phased array configuration. In this embodiment, the antenna unit is a stacked patch microstrip patch antenna. The main patches 295-296 are implemented on the package substrate 250 and is directly connected to the die 280 using low loss controlled impedance lines 298 (e.g., grounded coplanar waveguides (GCPWs), CPWs, microstrip or stripline transmission lines). The patches 293-294 are implemented on a secondary low loss substrate 270. In a typical platform, the second substrate 270 would be part of the device housing to reduce within platform losses. The substrate 270 can be glued or screwed to the support pillars. The device 200 can be coupled to an optional substrate (e.g., substrate 120, mother board, printed circuit board) with secondary level interconnect (SLI) 260.

Figure 3:
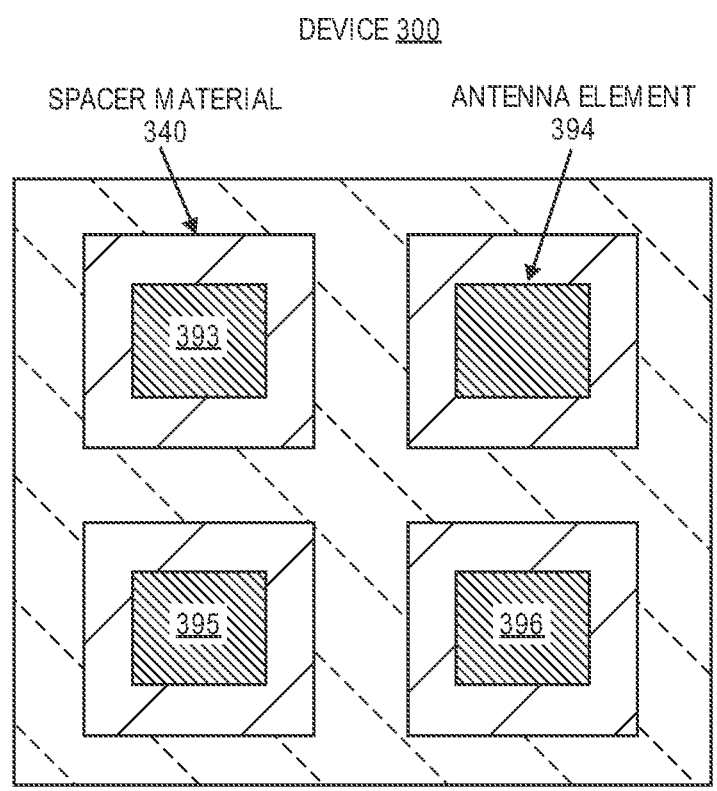
FIG. 3 illustrates a top view of a microelectronic device 300 having a flexible substrate and a distributed stacked patch antenna in accordance with one embodiment.
Figure 4:
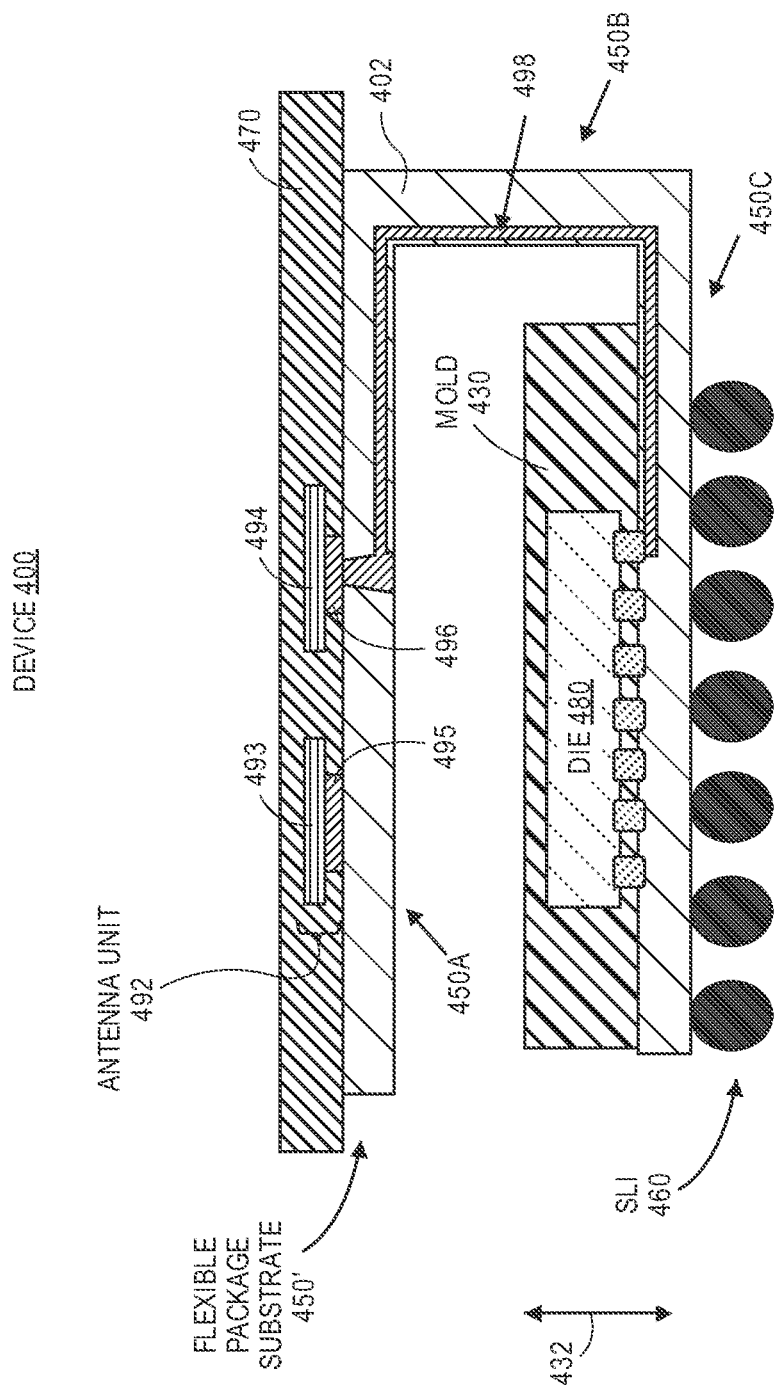
FIG. 4 illustrates a microelectronic device having a flexible substrate and a distributed antenna unit in accordance with one embodiment.

FIG. 3 illustrates a top view of a microelectronic device 300 having a flexible substrate and a distributed stacked patch antenna in accordance with one embodiment. The microelectronic device 300 includes similar components in comparison to the components of device 200. The device 300 illustrates a relative location of a spacer material 340 (e.g., dielectric pillars 240-241, non-dielectric pillars 240-241) with antenna elements 393-396 of at least one antenna unit. The spacer material 340 separates substrates (e.g., substrates 250 and 270) and does not overlap with the antenna elements. In some embodiments, the spacer material may be made out of metal or out of material composites. The spacer material may be designed to act as reflectors to enhance the overall antenna directivity and efficiency. FIG. 4 illustrates a microelectronic device having a flexible substrate and a distributed antenna unit in accordance with one embodiment. The microelectronic device 400 includes a flexible package substrate 450 having a first portion of the at least one distributed antenna unit 492 with antenna elements 495-496. A second portion of the at least one distributed antenna unit 292 includes antenna elements 493-494 that are positioned on a different substrate 470 (e.g., a device housing). The coupling between the antenna elements (e.g., patch antenna elements as illustrated in FIG. 4) occurs with direct contact between antenna elements 493 and 495 and direct contact between antenna elements 494 and 496. In one example, the antenna elements 495 and 496 on the package substrate 450 are significantly smaller than the antenna elements 493 and 494 of the substrate 470.

In another example, the at least one distributed antenna unit 492 or an additional antenna unit can integrate monopole, dipole, boresight, end fire, and side radiating antenna elements among other types of antennas. In another example, a slot resonant antenna may be used.

The main patch or bottom antenna elements 495-496 can be directly connected to the radio frequency die 480. The flexible package substrate 450 can be bent, folded, or twisted in multiple regions to create different sections 450a-450c or any desired positioning of these sections. The package substrate 450 includes at least one distributed stacked antenna unit 492, conductive layers (e.g., transmission lines 498), dielectric material 402 (e.g., organic material, low temperature co-fired ceramic materials, liquid crystal polymers, etc.), and different levels of conductive connections. In one example, the package substrate 450 has a thickness of 50 to 100 microns for ultra thin microelectronic devices. The section 450c includes ultra-thin multilayer organic package substrate on which at least one semiconductor die 480 is attached using either wirebonding or flip chip assembly. The semiconductor die 480 contains at least a radio frequency circuit such as a transceiver that operates in the GHz frequency range. The microelectronic die 480 is overmolded with mold material 430 to provide mechanical stability. The mold material 430 and section 450c can have a thickness 432 of 100 to 200 microns. The section 450a of the package substrate 450 contains one or multiple distributed antenna units 492. The antennas may be individual or arrange in a phased array configuration. In this embodiment, the antenna unit is a stacked patch microstrip patch antenna. The main patches 495-496 are implemented on the package substrate 450 and can be directly connected to the die 480 using low loss controlled impedance lines 498 (e.g., grounded coplanar waveguides (GCPWs), CPWs, microstrip or stripline transmission lines). The antenna elements 493-494 are implemented on a secondary low loss substrate 470. In a typical platform, the second substrate 470 would be part of the device housing to reduce within platform losses. The device 400 can be coupled to an optional substrate (e.g., substrate 420, mother board, printed circuit board) with secondary level interconnect (SLI) 460.

The package substrates, antenna elements, and mold material can have different thicknesses, length, and width dimensions in comparison to those disclosed and illustrated herein. The mold material may be a low loss nonconductive dielectric material.

In another embodiment, any of the devices or components can be coupled to each other.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 5:
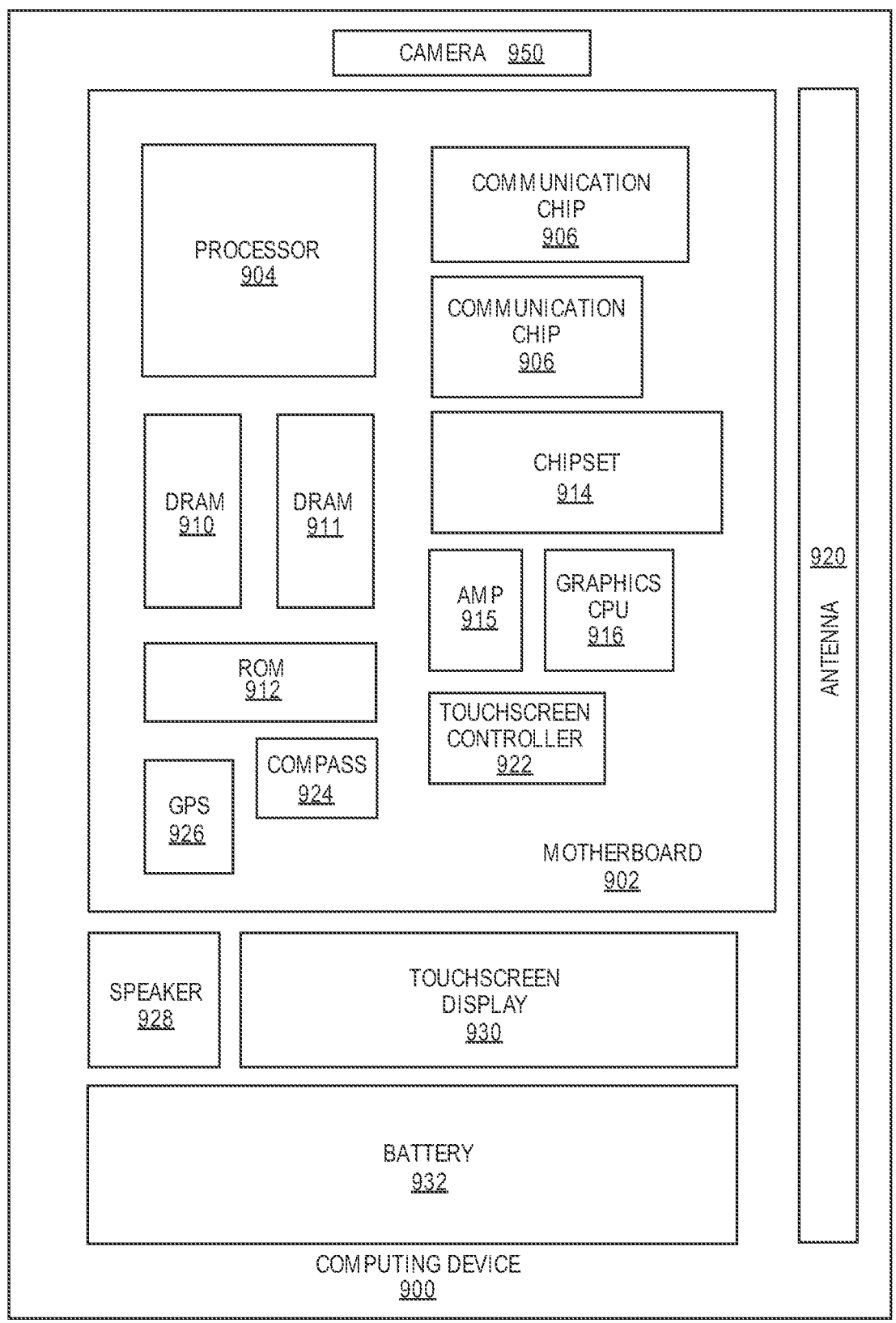
FIG. 5 illustrates a computing device 900 in accordance with one embodiment.

FIG. 5 illustrates a computing device 900 in accordance with one embodiment. The computing device 900 houses a board 902. The board (e.g., motherboard, printed circuit board, etc.) may include a number of components, including but not limited to at least one processor 904 and at least one communication module or chip 906. The at least one processor 904 is physically and electrically coupled to the board 902. In some implementations, the at least one communication module or chip 906 is also physically and electrically coupled to the board 902. In further implementations, the communication module or chip 906 is part of the processor 904. In one example, the communication module or chip 906 (e.g., microelectronic device 100, 200, 300, 400, etc.) includes a distributed antenna unit 920 (e.g., distributed antenna unit 192, 292, 492, etc.).

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna unit 920, a display, a touchscreen display 930, a touchscreen controller 922, a battery 932, an audio codec, a video codec, a power amplifier 915, a global positioning system (GPS) device 926, a compass 924, a gyroscope, a speaker, a camera 950, and a mass storage device (such as hard disk drive, compact disk (CD), digital versatile disk (DVD), and so forth).

The communication module or chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication module or chip 906 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication module or chips 906. For instance, a first communication module or chip 906 may be dedicated to shorter range wireless communications such as Wi-Fi, WiGig, and Bluetooth and a second communication module or chip 906 may be dedicated to longer range wireless communications such as GPS, EDGE, GPRS, CDMA, WiMAX, LTE, Ev-DO, 5G, and others.

The at least one processor 904 of the computing device 900 includes an integrated circuit die packaged within the at least one processor 904. In some embodiments of the invention, the processor package includes one or more devices, such as microelectronic devices (e.g., microelectronic device 100, 200, 300, 400, etc.) in accordance with implementations of embodiments of the invention. The term "processor" may refer to any device or portion of a device that processes electronic data from registers and/or memory to transform that electronic data into other electronic data that may be stored in registers and/or memory.

The communication module or chip 906 also includes an integrated circuit die packaged within the communication module or chip 906. In accordance with another implementation of embodiments of the invention, the communication module or chip package includes one or more microelectronic devices (e.g., microelectronic device 100, 200, 300, 400, etc.).

The following examples pertain to further embodiments. Example 1 is a microelectronic device that includes a first substrate having organic dielectric material, conductive layers, and a first portion of a distributed antenna unit. The first substrate supports at least one radio frequency (RF) component. A second substrate is coupled to the first substrate. The second substrate is integrated with a housing of the microelectronic device and includes a second portion of the distributed antenna unit for transmitting and receiving communications at a frequency of approximately 4 GHz or higher.

In example 2, the subject matter of example 1 can optionally include spacer material to form support pillars to provide a separation between the first and second substrates.

In example 3, the subject matter of any of examples 1-2 can optionally include the first portion of the distributed antenna unit comprising first antenna elements that are capacitively coupled to second antenna elements of the second portion of the distributed antenna unit.

In example 4, the subject matter of any of examples 1-3 can optionally include the first substrate having a thickness of 50 to 100 microns for forming the microelectronic device.

In example 5, the subject matter of any of examples 1-4 can optionally include the distributed antenna unit comprising at least one of a stacked patch antenna, a monopole antenna, a dipole antenna, a boresight antenna, an end fire antenna, a Vivaldi radiator, and a slot resonant antenna.

In example 6, the subject matter of any of examples 1-5 can optionally include the first portion of the distributed antenna unit comprising first antenna elements that contact second antenna elements of the second portion of the distributed antenna unit with the second antenna elements being formed within the second substrate.

In example 7, the subject matter of any of examples 1-6 can optionally include the distributed antenna unit being connected to the at least one RF component including at least one transceiver die to form a phased array antenna module of a 5G package architecture for 5G communications.

Example 8 is a microelectronic device comprising a first flexible substrate having organic dielectric material, conductive layers, and a first portion of a distributed antenna unit. The first flexible substrate includes first and second sections with the first section to support at least one radio frequency (RF) component that is overmolded with mold material. A second substrate is coupled to the first substrate. The second substrate includes a second portion of the distributed antenna unit for transmitting and receiving communications at a frequency of approximately 4 GHz or higher.

In example 9, the subject matter of example 8 can optionally include spacer material to form support pillars to provide a separation between the first and second substrates.

In example 10, the subject matter of any of examples 8-9 can optionally include the first portion of the distributed antenna unit comprising first antenna elements that are capacitively coupled to second antenna elements of the second portion of the distributed antenna unit.

In example 11, the subject matter of any of examples 8-10 can optionally include the first substrate having a thickness of 50 to 100 microns for forming the microelectronic device.

In example 12, the subject matter of any of examples 8-11 can optionally include the distributed antenna unit comprising at least one of a stacked patch antenna, a monopole antenna, a dipole antenna, a boresight antenna, an end fire antenna, a Vivaldi radiator, and a slot resonant antenna.

In example 13, the subject matter of any of examples 8-12 can optionally include the first portion of the distributed antenna unit comprising first antenna elements that contact second antenna elements of the second portion of the distributed antenna unit with the second antenna elements being formed within the second substrate that is integrated with a housing of the microelectronic device.

In example 14, the subject matter of any of examples 8-13 can optionally include the flexible substrate being bent to form the first and second sections with the second section including the first portion of the distributed antenna unit.

Example 15 is a computing device comprising at least one processor to process data and a communication module or chip coupled to the at least one processor. The communication module or chip comprises a first substrate having organic dielectric material, conductive layers, and a first portion of a distributed antenna unit. The first substrate supports at least one radio frequency (RF) component and a housing that is attached to a second substrate that is coupled to the first substrate. The second substrate includes a second portion of the distributed antenna unit for transmitting and receiving communications at a frequency of approximately 4 GHz or higher.

In example 16, the subject matter of example 15 can optionally include spacer material to form support pillars to provide a separation between the first and second substrates.

In example 17, the subject matter of any of examples 15-16 can optionally include the first portion of the distributed antenna unit comprising first antenna elements that are capacitively coupled to second antenna elements of the second portion of the distributed antenna unit.

In example 18, the subject matter of any of examples 15-17 can optionally include the first substrate having a thickness of 50 to 100 microns for forming the microelectronic device.

In example 19, the subject matter of any of examples 15-18 can optionally include the distributed antenna unit comprising at least one of a stacked patch antenna, a monopole antenna, a dipole antenna, a boresight antenna, an end fire antenna, a Vivaldi radiator, and a slot resonant antenna.

In example 20, the subject matter of any of examples 15-19 can optionally include the first portion of the distributed antenna unit comprising first antenna elements that contact second antenna elements of the second portion of the distributed antenna unit with the second antenna elements being formed within the second substrate.

What is claimed is:

1. A microelectronic device comprising:
   a first substrate having organic dielectric material, conductive layers, and a first portion of a distributed antenna unit, the first substrate supports at least one radio frequency (RF) component; and
   a second substrate coupled to the first substrate, the second substrate is integrated with a housing of the microelectronic device and includes a second portion of the distributed antenna unit for transmitting and receiving communications at a frequency of approximately 4 GHz or higher.

2. The microelectronic device of claim 1, further comprising spacer material to form support pillars to provide a separation between the first and second substrates.

3. The microelectronic device of claim 2, wherein the first portion of the distributed antenna unit comprises first antenna elements that are capacitively coupled to second antenna elements of the second portion of the distributed antenna unit.

4. The microelectronic device of claim 1, wherein the first substrate has a thickness of 50 to 100 microns for forming the microelectronic device.

5. The microelectronic device of claim 1, wherein the distributed antenna unit comprises at least one of a stacked patch antenna, a monopole antenna, a dipole antenna, a boresight antenna, an end fire antenna, a Vivaldi radiator, and a slot resonant antenna.

6. The microelectronic device of claim 1, wherein the first portion of the distributed antenna unit comprises first antenna elements that contact second antenna elements of the second portion of the distributed antenna unit with the second antenna elements being formed within the second substrate.

7. The microelectronic device of claim 1, wherein the distributed antenna unit is connected to the at least one RF component including at least one transceiver die to form a phased array antenna module of a 5G package architecture for 5G communications.

8. A microelectronic device comprising:
   a first flexible substrate having organic dielectric material, conductive layers, and a first portion of a distributed antenna unit, the first flexible substrate includes first and second sections with the first section to support at least one radio frequency (RF) component that is overmolded with mold material; and
   a second substrate coupled to the first substrate, the second substrate includes a second portion of the distributed antenna unit for transmitting and receiving communications at a frequency of approximately 4 GHz or higher.

9. The microelectronic device of claim 8, further comprising spacer material to form support pillars to provide a separation between the first and second substrates.

10. The microelectronic device of claim 9, wherein the first portion of the distributed antenna unit comprises first antenna elements that are capacitively coupled to second antenna elements of the second portion of the distributed antenna unit.

11. The microelectronic device of claim 8, wherein the first substrate has a thickness of 50 to 100 microns for forming the microelectronic device.

12. The microelectronic device of claim 8, wherein the distributed antenna unit comprises at least one of a stacked patch antenna, a monopole antenna, a dipole antenna, a boresight antenna, an end fire antenna, a Vivaldi radiator, and a slot resonant antenna.

13. The microelectronic device of claim 8, wherein the first portion of the distributed antenna unit comprises first antenna elements that contact second antenna elements of the second portion of the distributed antenna unit with the second antenna elements being formed within the second substrate that is integrated with a housing of the microelectronic device.

14. The microelectronic device of claim 8, wherein the first flexible substrate is bent to form the first and second sections with the second section including the first portion of the distributed antenna unit.

15. A computing device comprising:
   at least one processor to process data; and
   a communication module or chip coupled to the at least one processor, the communication module or chip comprises, a first substrate having organic dielectric material, conductive layers, and a first portion of a distributed antenna unit, the first substrate supports at least one radio frequency (RF) component; and
   a housing that is attached to a second substrate that is coupled to the first substrate, the second substrate includes a second portion of the distributed antenna unit for transmitting and receiving communications at a frequency of approximately 4 GHz or higher.

16. The computing device of claim 15, further comprising spacer material to form support pillars to provide a separation between the first and second substrates.

17. The computing device of claim 16, wherein the first portion of the distributed antenna unit comprises first antenna elements that are capacitively coupled to second antenna elements of the second portion of the distributed antenna unit.

18. The computing device of claim 16, wherein the first substrate has a thickness of 50 to 100 microns for forming a microelectronic device.

19. The computing device of claim 16, wherein the distributed antenna unit comprises at least one of a stacked patch antenna, a monopole antenna, a dipole antenna, a boresight antenna, an end fire antenna, a Vivaldi radiator, and a slot resonant antenna.

20. The computing device of claim 15, wherein the first portion of the distributed antenna unit comprises first antenna elements that contact second antenna elements of the second portion of the distributed antenna unit with the second antenna elements being formed within the second substrate.

* * * * *